United States Patent
Tatsuta et al.

(10) Patent No.: US 6,713,844 B2
(45) Date of Patent: Mar. 30, 2004

(54) SEMICONDUCTOR-CHIP MOUNTING SUBSTRATE HAVING AT LEAST ONE PROJECTION THEREON AND A PRESSURE HOLDING MEANS

(75) Inventors: Jun Tatsuta, Ibaraki (JP); Masao Kubo, Nara (JP); Shinobu Kida, Shijonawate (JP); Shigenari Takami, Uda-gun (JP); Ikko Kuzuhara, Toyonaka (JP); Kyoji Tanaka, Kobe (JP); Yoshiharu Sanagawa, Sakai (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 10/026,639

(22) Filed: Dec. 27, 2001

(65) Prior Publication Data

US 2002/0121706 A1 Sep. 5, 2002

(30) Foreign Application Priority Data

Dec. 28, 2000 (JP) .................. 2000-402818

(51) Int. Cl.[7] .............................. H01L 23/48
(52) U.S. Cl. .................. 257/629; 257/633; 257/733; 257/737; 257/727; 174/52.1; 174/52.5
(58) Field of Search .................. 257/622, 623, 257/737, 688, 727, 633, 629, 733; 174/52.1, 52.2, 52.3, 52.5

(56) References Cited

U.S. PATENT DOCUMENTS

| | | | | | |
|---|---|---|---|---|---|
| 5,478,779 | A | * | 12/1995 | Akram | 437/189 |
| 5,523,586 | A | * | 6/1996 | Sakurai | 257/48 |
| 5,578,526 | A | * | 11/1996 | Akram et al. | 437/209 |
| 5,789,278 | A | * | 8/1998 | Akram et al. | 438/118 |
| 5,790,377 | A | * | 8/1998 | Schreiber et al. | 361/704 |
| 6,002,180 | A | * | 12/1999 | Akram et al. | 257/783 |
| 6,271,058 | B1 | * | 8/2001 | Yoshida | 438/108 |
| 6,525,429 | B1 | * | 2/2003 | Kovac et al. | 257/778 |

FOREIGN PATENT DOCUMENTS

JP          10-199935          7/1998

* cited by examiner

Primary Examiner—Kamand Cuneo
Assistant Examiner—Lourdes Cruz
(74) Attorney, Agent, or Firm—Oblon, Spivak, McClelland, Maier & Neustadt, P.C.

(57) ABSTRACT

A semiconductor-chip mounting substrate with a high degree of reliability of an electrical connection between a substrate and a semiconductor chip such as IC chips is provided. The substrate has at least one projection thereon, which is integrally molded with the substrate. A conductive layer is formed on the projection to obtain a first bump. The semiconductor chip has a terminal projecting as a second bump on its surface. The semiconductor chip is mounted on the substrate such that the first bump contacts the second bump. A required contact pressure between the first bump and the second bump is held by use of a pressure holding means.

22 Claims, 7 Drawing Sheets

SEMICONDUCTOR-CHIP MOUNTING SUBSTRATE HAVING AT LEAST ONE PROJECTION THEREON AND A PRESSURE HOLDING MEANS

FIELD OF THE INVENTION

The present invention relates to a semiconductor-chip mounting substrate with a high degree of reliability of an electrical connection between a substrate and a semiconductor chip such as IC chip, and a method of manufacturing the same.

BACKGROUND OF THE INVENTION

As a conventional method of surface mounting (flip chip bonding) a semiconductor chip such as IC chips on a substrate, for example, there is a work mounting method disclosed in Japanese Patent Early Publication [kokai] No. 10-199935. In this method, bumps that are projections having electrical conductivity are formed on an IC chip and a substrate, and the bumps of the IC chip are pressed against the bumps of the substrate to cause plastic deformations of the bumps, so that electrical connections therebetween are achieved.

However, in the above method, since a large number of the bumps are formed on the substrate, variations in height of the bumps on the substrate easily increase. In such a case, when the bumps of the substrate are bonded to the bumps of the IC chip, it becomes difficult to provide a constant contact pressure to each of the electrical connections between the bumps. In addition, forming the bumps having the constant height individually on the substrate leads to an extension in production time by a large amount.

Moreover, as the packaging density of IC chips becomes higher, a total number of terminals of the respective IC chip increases. To achieve favorable electrical connections on all of the terminals, it is needed to severely control the flatness of an IC-chip mounting surface of the substrate. However, in actuality, due to a warpage of the substrate after molding, it is difficult to stably supply the substrate with a high level of the flatness. As a result, there is a fear that the reliability of electrical connections in the IC-chip mounting substrate lowers.

On the other hand, when using a resin substrate for MID (molded interconnect device) as the substrate, a coefficient of linear expansion of the semiconductor chip (approximately $4 \times 10^{-6}/°C$.) is much smaller than that of the substrate (approximately $20 \sim 50 \times 10^{-6}/°C$.). Because of such a great difference in the coefficient of linear expansion therebetween, a large thermal stress occurs at the interface between the substrate and the semiconductor chip. This thermal stress becomes a cause of further reducing the reliability of the electrical connections between the semiconductor chip and the substrate.

SUMMARY OF THE INVENTION

Therefore, a primary object of the present invention is to provide a semiconductor-chip mounting substrate with a high degree of reliability in electrical connection between a substrate and a semiconductor chip.

That is, the semiconductor-chip mounting substrate comprises:

a substrate having at least one projection thereon, which is integrally molded with the substrate;

a first bump obtained by forming a conductive layer on the projection; and a semiconductor chip having a terminal projecting as a second bump on its surface;

wherein the semiconductor chip is mounted on the substrate such that the first bump contacts the second bump, and the semiconductor-chip mounting substrate comprises a pressure holding means for providing a required contact pressure between the first bump and the second bump.

In the present invention, when integrally molding a plurality of projections with the substrate, it is possible to provide the first bumps with reduced variations in height on the substrate at a time. This brings a considerable decrease in production time and an improvement of production yields of the semiconductor-chip mounting substrate. In addition, even when a level of flatness of a semiconductor-chip mounting surface of the substrate is not so high, and there is a relatively large difference in coefficient of linear expansion between materials of the substrate and the semiconductor chip, the required contact pressure between the first and second bumps is provided and maintained by the pressure holding means. Therefore, it is possible to stably ensure the reliability of the electrical connection between the first and second bumps.

It is preferred that the pressure holding means is a resin material filled and cured in a space between the substrate and the semiconductor chip.

As the pressure holding means, it is also preferred to use a pressure holding member having a first surface adapted to contact a surface opposed to the second bump of the semiconductor chip, and a second surface extending around the first surface. In this case, the substrate has a concave, in which the semiconductor chip can be incorporated. The first bump is integrally molded at a bottom surface of the concave with the substrate. The second surface of the pressure holding member is bonded to the substrate such that the first surface of the pressure holding member pushes the semiconductor chip placed in the concave toward the substrate, to thereby provide the required contact pressure between the first bump and the second bump.

Another object of the present invention is to provide a method of manufacturing a semiconductor-chip mounting substrate. That is, this method comprises the steps of:

providing a substrate having at least one projection thereon, which is integrally molded with said substrate;

forming a conductive layer on the projection to obtain a first bump;

providing a semiconductor chip having a terminal projecting as a second bump on its surface;

pressing the second bump against the first bump under a pressure that is in an elastic deformation range of the first bump and causes a plastic deformation of the second bump, to bring the second bump into intimate contact with the first bump, and providing the pressure holding means to hold a required contact pressure between the first bump and the second bump under the intimate contact condition.

These and still other objects and advantages will become apparent from preferred embodiments of the present invention described below and the attached drawings.

The present disclosure relates to subject matter contained in Japanese Patent application No. 2000-402818, filed on Dec. 28, 2000, the disclosure of which is expressly incorporated herein by reference in its entirety.

PREFERRED EMBODIMENTS OF THE INVENTION

The present invention is explained below according to preferred embodiments. However, the present invention is not limited to these embodiments. Various modifications are available within a scope of the present invention.

(First Embodiment)

Figure 1A:
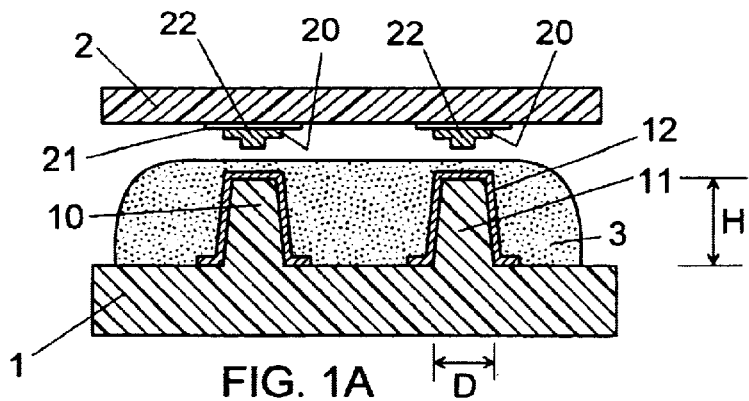
FIGS. 1A and 1B are schematic cross-sectional views illustrating a method of manufacturing a semiconductor-chip mounting substrate according to a first embodiment of the present invention.
Figure 1B:
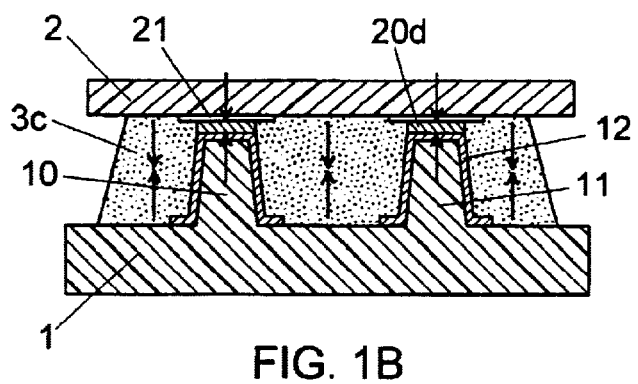

As shown in FIGS. 1A and 1B, a semiconductor-chip mounting substrate of the first embodiment has a substrate 1 with projections 11 thereon, which are integrally molded with the substrate, first bumps 10 obtained by forming conductive layers 12 on the projections 11, and a semiconductor chip 2 having terminals 22 projecting as second bumps 20 on its surface. The numeral 21 designates an electrode put between the terminal 22 and the semiconductor chip 2. For example, when the substrate 1 is made of a resin, it is preferred to use injection molding to obtain the substrate. When the substrate 1 is made of a ceramic material, the substrate can be obtained by performing injection molding with use of a mixture of a ceramic powder and a binder, and sintering a resultant molded article. The semiconductor chip 2 is mounted on the substrate 1 such that the first bumps 10 contact the second bumps 20. In this embodiment, a required contact pressure between the first and second bumps is provided and maintained by a pressure holding means, which is a resin material 3c filled and cured in a space between the substrate 1 and the semiconductor chip 2.

It is preferred that the second bump 20 has a higher plastic deformation capability than the first bump 10. This means that a plastic deformation of the second bump 20 is easily caused as compared with that of the first bump 10. By the plastic deformation of the second bump, it is possible to bring the second bump into intimate contact with the first bump. In addition, even when there are relatively large variations in height of the first bumps, a constant contact pressure can be provided in all of electrical connections between the first and second bumps. In other words, as the height of the first bump is larger than a mean height, a greater amount of plastic deformation of the second bump appears at the time of bonding with the first bump. On the contrary, as the height of the first bump is smaller than the mean height, a smaller amount of plastic deformation of the second bump appears at the time of bonding with the first bump. Thus, since the amounts of plastic deformation of the second bumps are determined in response to variations in height of the first bumps, so that the height of each of the second bumps is suitably adjusted, it is possible to ensure the reliability of the electrical connections between the first and second bumps.

In addition, it is preferred that the first bump 10 has a higher elastic deformation capability than the second bump 20. This means that the first bump 10 has a higher resistance to plastic deformation as compared with the second bump 20. Since a thermal stress generated at each of bonding interfaces between the first and second bumps by a difference in coefficient of linear expansion between the substrate and the semiconductor chip is used to cause the elastic deformation of the first bump, it is possible to prevent a situation that the reliability of the electrical connections therebetween is reduced by the thermal stress. From this viewpoint, it is preferred that a material of the first bump, i.e., the substrate material, has an elastic modulus of 5 GPa or more, and particularly 10 GPa or more.

Thus, when the first bump 10 having the high elastic-deformation capability is pressed against the second bump 20 having the high plastic deformation capability to make the electrical connection therebetween, and the contact pressure between the first and second bumps is maintained by the cured resin material 3c as the pressure holding means, the semiconductor-chip mounting substrate of the present invention can provide the high reliability of the electrical connections over an extended time period.

In the present invention, the "required contact pressure" means a pressure value needed to ensure a sufficient reliability of the electrical connection between the first and second bumps. Concretely, it is preferred that the required contact pressure is within a range of 28 to 170 N/mm$^2$, and particularly 57 to 110 N/mm$^2$. As an example, when the second bump is made of gold, and a contact surface after bonding between the second bump and the corresponding first bump is of a substantially circular shape having a diameter of about 75 $\mu$m, it is preferred to apply a load of 0.5N to 3N, and particularly 1N to 2N to achieve a favorable plastic deformation of the second bump without the plastic deformation of the first bump. When the load exceeds 3N, there is a fear that the plastic deformation of the first bump appears.

It is preferred that the resin mater 3 used as the pressure holding means has a coefficient of linear expansion greater than a material of the substrate 1. Concretely, it is preferred that a difference in coefficient of linear thermal expansion (linear expansion) between the resin material and the substrate material (=the projection 11 for the first bump 10) is within a range of 5×10$^{-6}$/° C. to 6×10$^{-6}$/° C. When the difference is less than 5×10$^{-6}$/° C., the required contact pressure described above may not be obtained. On the other hand, when the difference is more than 60×10$^{-6}$/° C., distortion occurs between the cured resin mater 3c and the substrate 1 or the semiconductor chip 2 because of excessive shrinkage caused in every directions by curing of the resin material, so that the adhesion strength there between may lower.

As the substrate material, for example, it is possible to use polyphthalamide (PPA), polyphenylene sulfide, polyether imide, polyether nitrile, and polyether ketone. Coefficient of linear expansion and elastic modulus of each of these substrate materials are listed in Table 1. If necessary, these substrate materials may contain a filer such as inorganic fibers. Alternatively, ceramics such as alumina may be used as the substrate material. The kind of resin material filled in the space between the substrate and the semiconductor chip is not specifically limited, however, it is preferred to use a resin material satisfying the above range of the difference in the coefficient of linear expansion. As an example, it is recommended to use a combination of polyphthalamide ($25 \times 10^{-6}/°$ C.) as the substrate material and an epoxy resin ($55 \times 10^{-6}/°$ C.) as the resin material.

TABLE 1

| Resin Compound | Coefficient of linear expansion ($\times 10^{-6}/°$ C.) | Elastic modulus (GPa) |
| --- | --- | --- |
| polyphthalamide | 17~32 | 15~16 |
| polyphenylene sulfide | 21~24 | 11~12 |
| polyether imide | 23~27 | 5~6 |
| polyether nitrile | 19~22 | 13~14 |
| polyether ketone | 23~42 | 6~10 |

With respect to the conductive layer 12, it is preferred to form, on the projection 11, a nickel film having a thickness of 5 $\mu$m or more, and particularly 8 to 20 $\mu$m. The thick nickel film is effective to increase the resistance to plastic deformation of the first bump 10. In addition, it is preferred that the conductive layer 12 is composed of a copper film directly formed on the projection, the thick nickel film on the copper film, and a gold film on the thick nickel film.

Figure 13:
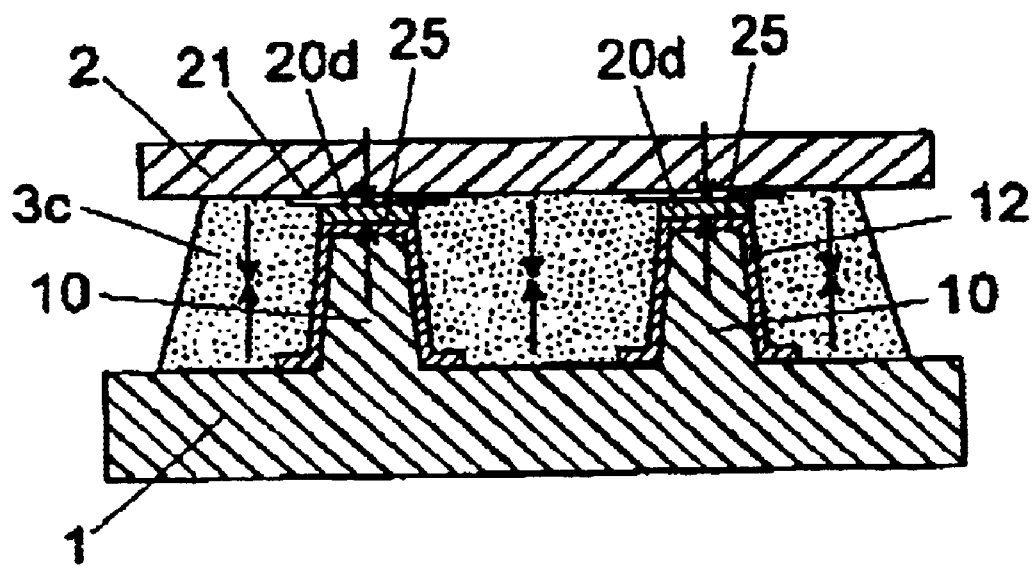
FIG. 13 is a schematic cross-sectional view of a modification of the first embodiment.

To further improve adhesion between the first bump 10 and the second bump 20, it is preferred that one of the first and second bumps has a surface layer of a material selected from tin and tin alloys, and the other one has a gold layer. In this case, as shown in FIG. 13, a solid state diffusion layer 25 of tin and gold is formed at the interface between the first and second bumps (10, 20d.) For example, this sold state diffusion layer can be generated at a temperature of 150 to 200° C. under the pressure.

It is also preferred that a surface roughness (Ra) of at least a top surface of the first bump 10 is within a range of 0.1 to 3 $\mu$m to achieve an improvement of the adhesion by an anchor effect. In particular, when the side and top surfaces of the first bump have the surface roughness of the above range, the adhesion between the cured resin material 3c and the substrate 1 can be further improved.

With respect to a shape of the first bump 10, it is preferred that the first bump is of a tapered shape having a flat top end, and a value determined by dividing a height (H) of the first bump by a diameter (D) of a circle having substantially the same area as a base of the first bump, as shown in FIG. 1A, is 0.5 or more, more preferably 0.7 or more, and particularly 1 or more. For example, when the first bump 10 is of a truncated cone shape, it is preferred that the value determined by dividing a height of the truncated cone by a diameter of the base of the truncated cone satisfies the above conditions. Alternatively, when the first bump is of a truncated pyramid shape such as truncated triangular pyramid, it is preferred that the value determined by dividing a height of the truncated pyramid by a diameter of a circle having substantially the same area as the base of the truncated pyramid satisfies the above conditions. The truncated pyramid or cone can be obtained by removing from a pyramid or a cone their tops by cuts parallel to their bases.

With respect to a shape of the second bump 20, it is preferred that the second bump is of a tapered shape such as a cone because the plastic deformation of the second bump can be uniformly caused in every directions perpendicular to a pressure direction at the time of pressing the second bump against the first bump 10. Of course, as in the case of the first bump 10, the second bump may be formed with a tapered shape having a flat top end. In addition, it is preferred that a diameter of the second bump 20 and the diameter of a deformed second bump 20d after bonding are smaller than the diameter of the flat top end of the first bump 10. For example, when a pitch between adjacent bumps is 200 $\mu$m or more, it is recommended that diameters of the base and the flat top end of the first bump 10 are about 125 $\mu$m and about 100 $\mu$m, respectively, a height of the first bump is about 90 $\mu$m, and the diameter and the height of the deformed second bump 20d after bonding are about 75 $\mu$m and about 30 $\mu$m, respectively.

On the other hand, when the pitch between the adjacent bumps is 75 $\mu$m or less to achieve a high-density mounting, it is preferred that the diameters of the base and the flat top end of the first bump 10 are about 30 $\mu$m and about 20 $\mu$m, respectively, the height of the first bump 10 is about 40 $\mu$m or more, and the diameter of the deformed second bump 20d after bonding is 20 $\mu$m or more. Moreover, when the pitch between the adjacent bumps is 50 $\mu$m or less to achieve a further high-density mounting, it is preferred that the diameters of the base and the flat top end of the first bump 10 are about 20 $\mu$m and about 15 $\mu$m, respectively, the height of the first bump 10 is about 20 $\mu$m or more, and the diameter of the deformed second bump 20d after bonding is 10 $\mu$m or more. Since the plastic deformation of the second bump 20 appears at the time of bonding the first bump 10 to the second bump, the height of the second bump after the bonding becomes smaller by about 10 to 15 $\mu$m than that of the second bump before the bonding.

With respect to the second bump 20 of the semiconductor chip 2, it is preferred that the second bump is made of a solder material. In this case, it is possible to easily achieve the plastic deformation of the second bump by pressing the second bump against the first bump under a relatively low pressure. It is also preferred that the second bump 20 and the conductive layer 12 of the first bump 10 are made of gold. In this case, it is possible to mount the semiconductor chip 2 on the substrate 1 under conditions of narrow pitches (<100 $\mu$m) between adjacent second bumps and between adjacent first bumps. Such a high-density mounting is hard to achieve by solder bonding.

The semiconductor-chip mounting substrate described above can be manufactured by the following method. That is, an intermediate assembly is first produced, which is composed of the semiconductor chip 2 placed on the substrate 1 such that the first bumps 10 contact the second bumps 20, and the resin material 3 filled in the space between the semiconductor chip and the substrate. For example, as shown in FIG. 1A, the resin material 3 is supplied on the top surface of the substrate 1 having the first bumps 10, and then the semiconductor chip 2 is placed on the substrate such that the first bumps 10 contact the second bumps 20 to obtain the intermediate assembly. Alternatively, after the semiconductor chip 2 is firstly placed on the substrate 1, the resin material 3 may be charged into the space between the semiconductor chip and the substrate to obtain the intermediate assembly.

Next, a suitable load is applied to the intermediate assembly such that the second bumps 20 are pressed against the first bumps 10 under a pressure that is within an elastic deformation range of the first bump and causes a plastic deformation of the second bump, to thereby bring the second bumps into intimate contact with the first bumps. Under the intimate contact condition, the resin material filled in the intermediate assembly is cured. A shrinkage caused by the curing of the resin material maintains the required contact pressure between the first and second bumps in the semiconductor-chip mounting substrate, as indicated by the arrows in FIG. 1B.

Alternatively, the semiconductor-chip mounting substrate of the present invention may be manufactured by the following method. That is, after the semiconductor chip 2 is placed on the substrate 1, the second bumps 20 are bonded to the first bumps 10 by solder bonding, while the second bumps being pressed against the first bumps. Then, the resin material 3 is charged and cured in the space between the substrate and the semiconductor chip under an intimate contact condition between the first and second bumps. The supply of a solder material can be performed by applying a cream solder on at least one of the first bump 10 and the corresponding second bump 20 by a dispender. The supply of the solder material may be performed by dipping only top portions of the first bumps and/or the second bumps in a solder bath. In addition, solder films may be formed on top surfaces of the first bumps and/or the second bumps by conventional plating technique.

When the resin material is a thermosetting resin, the thermosetting resin in the intermediate assembly is cured at a raised temperature under the intimate contact condition described above, and then a resultant cured resin material is cooled from the raised temperature to room temperature. It is particularly preferred that the thermosetting resin material has a coefficient of linear expansion greater than the substrate material. In addition, when an amount of shrinkage caused by cooling of the cured resin material is larger than the amount of shrinkage caused by cooling of the substrate material (=first bump), the contact pressure between the first bumps and the second bumps increases to further improve the reliability of the electrical connections therebetween.

When the second bump 20 is made of a solder material, and the resin material 3 is a thermosetting resin, the thermosetting resin in the intermediate assembly is cured at a raised temperature lower than a melting point of the solder material, and then the intermediate assembly is heated at a temperature of the melting point of the solder material or more to carry out soldering between the first bump 10 and the second bump 20. The second bumps 20 of the solder material can be produced by plating or dropping molten solder. In addition, the second bumps 20 may be solder wire stud bumps. For example, when a curing temperature of the resin material 3 is within a range of 120° C. to 150° C., and the melting point of the solder material is about 183° C., the intermediate assembly is firstly heated at a temperature of about 160° C. under a pressure to cure the resin material in the intermediate assembly. At this time, the resin material 3 between the first bumps 10 and the second bumps 20 is removed to make direct contacts therebetween. Then, by heating the intermediate assembly at a temperature of 183° C. or more, the solder material of the second bumps is melted to carry out the solder bonding between first bumps and the second bumps.

In each of the solder bonding steps described above, it is preferred to carry out the solder bonding in vacuum or an inert-gas atmosphere to avoid the use of a flux. Alternatively It is also preferred to perform a plasma treatment for removing oxide films to surfaces of the first and second bumps prior to the solder bonding.

In addition, the electrical connections between the first bumps 10 and the second bumps 20 may be made by use of a conductive paste. In this case, since the first bumps can be bonded to the second bumps at a lower temperature of 120 to 150° C. as compared with the solder bonding, it is possible to prevent the occurrence of thermal damage of the semiconductor chip 2.

Moreover, to further increase the bonding strength between the first bumps 10 and second bumps 20, it is preferred to bond the second bumps to the first bumps by ultrasonic bonding. In particular, it is preferred to carry out the ultrasonic bonding, while curing the resin material 3 in the intermediate assembly at a raised temperature. When the second bumps 20 and the conductive layers 12 of the first bumps 10 are made of gold, the electrical connections between the first and second bumps made by the ultrasonic bonding exhibit extremely high reliability.

To supply the resin material 3, a resin sheet may be put between the semiconductor chip 2 and the substrate 1.

Figure 2A:
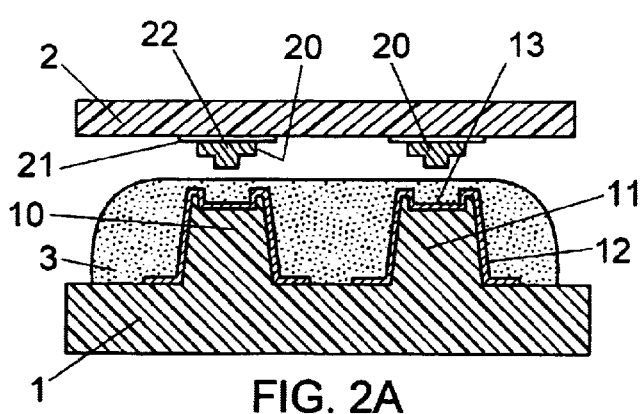
FIGS. 2A and 2B are schematic cross-sectional views illustrating a first modification of the first embodiment.
Figure 2B:
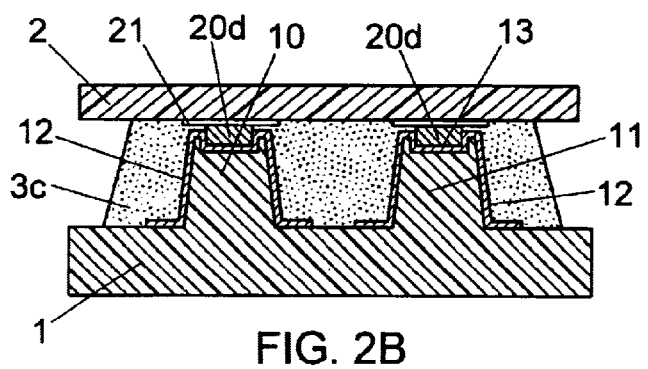

As a first modification of the above embodiment, it is preferred that recesses 13 for receiving the second bumps 22 of the semiconductor chip 2 are formed in top surfaces of the first bumps 11, as shown in FIGS. 2A and 2B. Since the second bumps 22 are caught by the recesses 13 at the time of bonding the second bumps to the first bumps 10, it is possible to mount the semiconductor chip 2 on the substrate 1 with high positioning accuracy. In addition, since the plastic deformations of the second bumps 20 appear in the recesses 13, so that each of the deformed second bumps 20d fits the inner surface of the recess 13, the contact area between the first bump and the second bump increases. This brings an improvement of the reliability of the electrical connection therebetween.

Figure 3A:
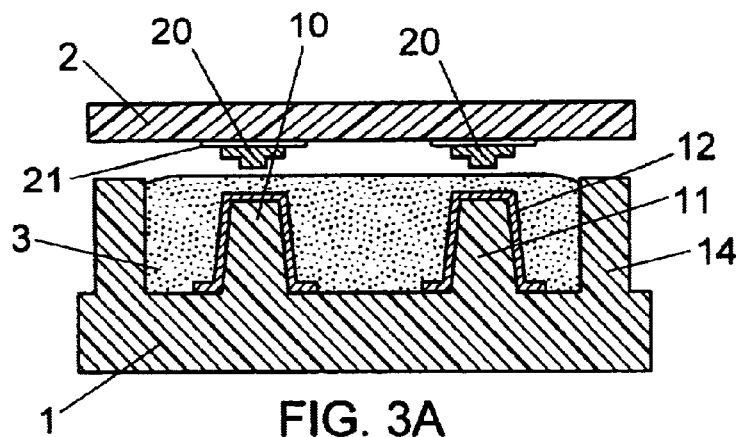
FIGS. 3A and 3B are schematic cross-sectional views illustrating a second modification of the first embodiment.
Figure 3B:
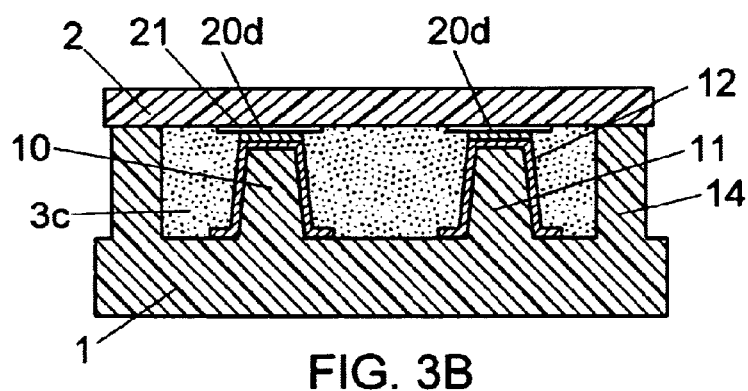

As a second modification of the above embodiment, it is preferred that the substrate 1 has second projections 14 as a stopper with a height of preventing the occurrence of an excessive contact pressure between the first bumps 11 and the second bumps 22 at the time of mounting the semiconductor chip 2 on the substrate 1, as shown in FIGS. 3A and 3B. In this case, it is possible to ensure a constant distance between the substrate 1 and the semiconductor chip 2, and enhance production yields by preventing excessive plastic deformations of the second bumps 20.

Figure 4:
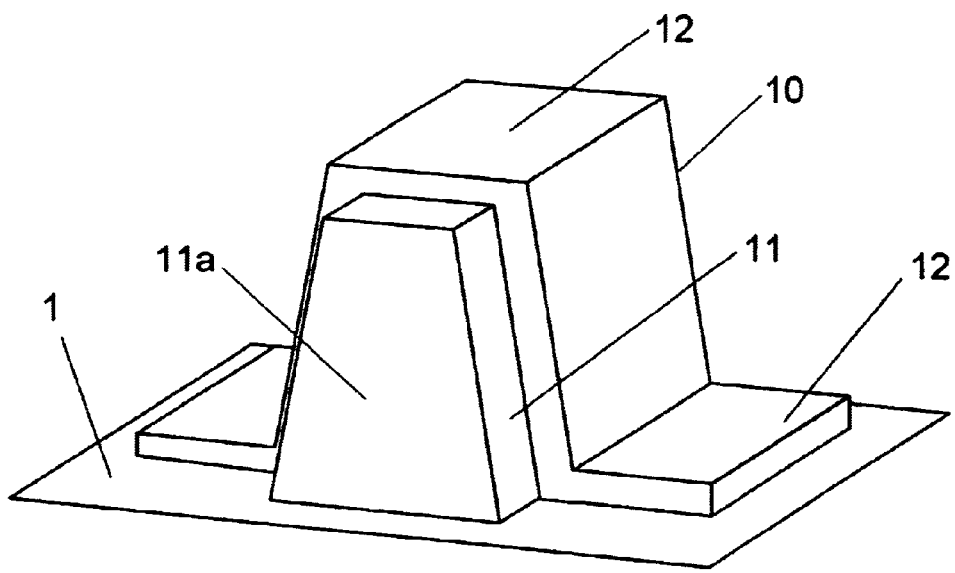
FIG. 4 is a partially perspective view illustrating a third modification of the first embodiment.

As a third modification of the above embodiment, it is preferred that a side of the first bump 10 is a conductive-layer free surface 11a at which a side of the projection 11 is exposed, as shown in FIG. 4. By the formation of the conductive-layer free surface 11a, the elastic deformation of the first bump 10 is enhanced when the second bump 20 is pressed against the first bump.

Figure 5A:
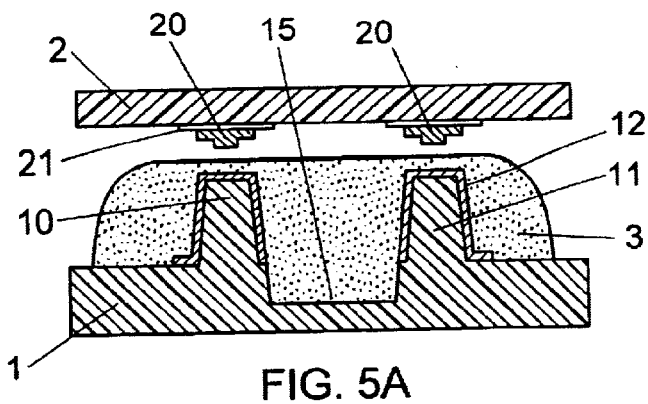
FIGS. 5A and 5B are schematic cross-sectional views illustrating a fourth modification of the first embodiment.
Figure 5B:
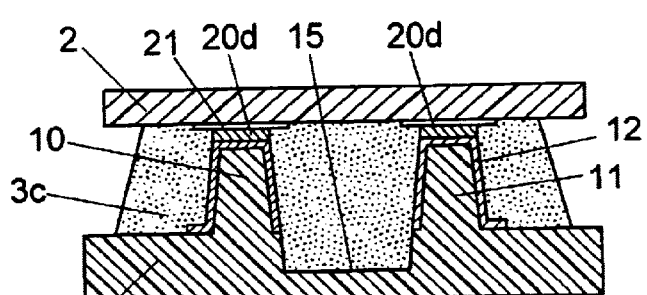

As a fourth modification of the above embodiment, it is preferred that the substrate 1 has a concave 15 between adjacent projections 11, in which the resin material 3 is filled, as shown in FIGS. 5A and 5B. In this case, a larger amount of the resin material 3 can be charged into the space between the substrate 1 and the semiconductor chip 2 by the formation of the concave 15. As a result, since a total amount of shrinkage caused by curing of the resin material 3 in the concave 15 increases, it is possible to provide a higher contact pressure between the first bumps 10 and the second bumps 20. Thus, the formation of the concave 15 is effective to further improve the reliability of the electrical connections therebetween. It is preferred that a depth of the concave 15 is 20 μm or more, and particularly 30 μm or more. The depth of the concave 15 is defined as a difference in height between the top surfaces of the substrate 1 at the inside and the outside of the adjacent first bumps 10, as shown in FIG. 5A.

Figure 6A:
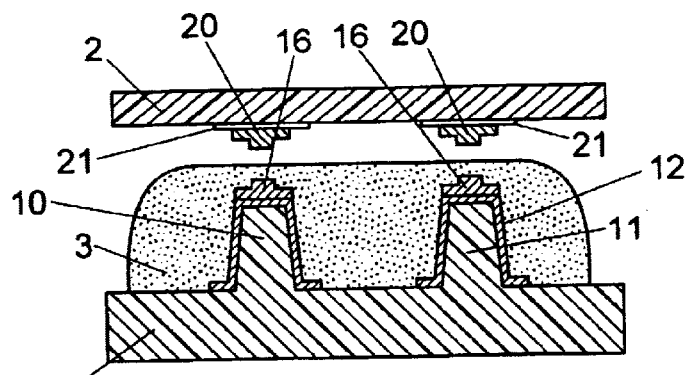
FIGS. 6A and 6B are schematic cross-sectional views illustrating a fifth modification of the first embodiment.
Figure 6B:
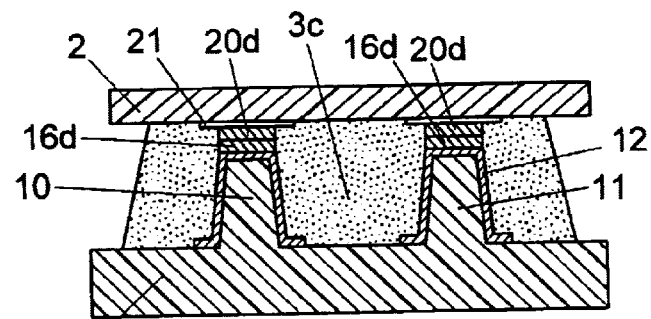

As a fifth modification of the above embodiment, it is preferred that the second bumps 20 are pressed against the first bumps 10 through cushion members 16 of a metal material that is excellent in plastic deformation capability, as shown in FIGS. 6A and 6B. As the metal material, it is preferred to use gold, aluminum or a solder material. For example, as the cushion member 16, a gold (Au) stud bump, aluminum (Al) stud bump or a solder stud bump may be formed on the first bump 10. Since plastic deformations of both of the second bump 20 and the cushion member 16 appear at the time of pressing the second bump against the cushion member on the first bump 10, an intimate contact is made between the deformed second bump 20*d* and cushion member 16*d*, as shown in FIG. 6B. In addition, the use of the cushion member 16 is effective to ensure the reliability of the electrical connections between the first bumps and the second bumps when variations in height of the first bumps 10 on the substrate 1 are relatively large. It is preferred that a thickness of the cushion member 16 is 20 $\mu$m or more.

(Second Embodiment)

Figure 7A:
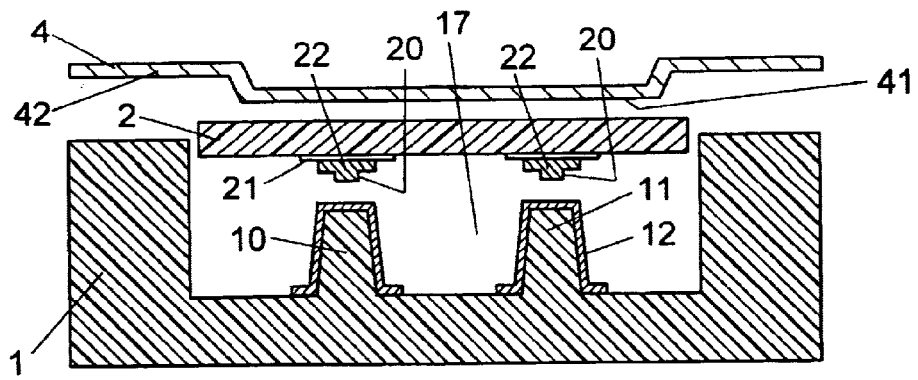
FIGS. 7A and 7B are schematic cross-sectional views illustrating a method of manufacturing a semiconductor-chip mounting substrate according to a second embodiment of the present invention.
Figure 7B:
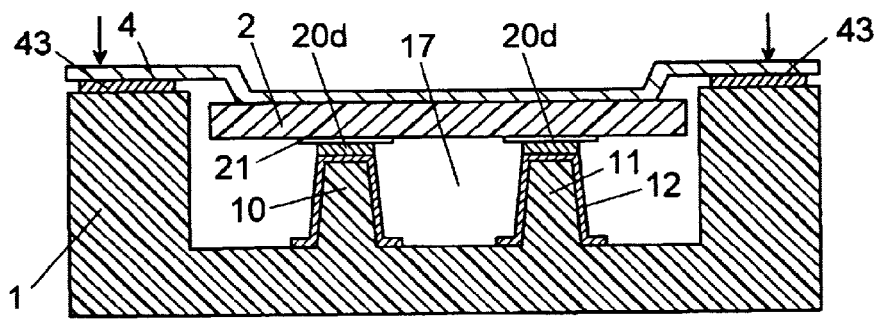

As shown in FIGS. 7A and 7B, a semiconductor-chip mounting substrate of the second embodiment is mainly composed of a substrate 1 having projections 11 thereon, which is integrally molded with the substrate, first bumps 10 obtained by forming conductive layers 12 on the projections 11, and a semiconductor chip 2 having terminals 22 projecting as second bumps 20 on its surface. The substrate 1 has a concave 17, in which the semiconductor chip 2 can be incorporated. The projections 11 are integrally formed at a bottom surface of the concave 17 with the substrate. The numeral 21 designates an electrode put between the terminal 22 and the semiconductor chip 2. The semiconductor chip 2 is mounted on the substrate 1 such that the first bumps 10 contact the second bumps 20. In this embodiment, a required contact pressure between the first bumps 10 and the second bumps 20 is maintained by a pressure holding member 4, which is pressed against a rear surface of the semiconductor chip 2.

The pressure holding member 4 has a first surface 41 adapted to contact the rear surface of the semiconductor chip 2, and a second surface 42 extending around the first surface. On the pressure holding member 4 of this embodiment, the first surface 41 is different in height from the second surface 42. The second surface 42 of the pressure holding member 4 is bonded to the substrate 1 such that the first surface 41 of the pressure holding member 4 projects toward the interior of the concave 17. As a result, the second bumps 20 of the semiconductor chip 2 placed in the concave 17 is pressed against the first bumps 10 of the substrate 1 by the first surface 41 of the pressure holding member 4, so that the required contact pressure therebetween is maintained.

It is preferred that the pressure holding member 4 is made of a material for springs. It is possible to prevent mechanical damage to the semiconductor chip 2. The pressure holding member 4 is bonded to the substrate 1 by use of an adhesive 43. Shrinkage caused by curing of the adhesive is useful to increase the contact pressure between the first and second bumps (10, 20).

Figure 8:
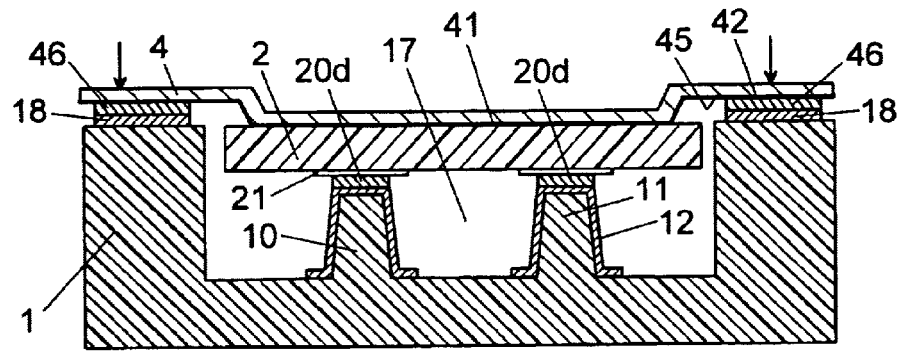
FIG. 8 is a schematic cross-sectional view illustrating a first modification of the second embodiment.

As a first modification of the second embodiment, the pressure holding member 4 may be bonded to the substrate 1, as shown in FIG. 8. That is, the pressure holding member 4 a conductive film 45 on the first surface 41, and a first metal film 46 formed on the second surface 42 so as to make an electrical connection with the conductive film 45. The substrate 1 has a second metal film 18 on its top surface around the concave 17. The pressure holding member 4 is connected to the substrate 1 by an alloy layer generated at the interface between the first metal film 46 and the second metal film 18. It is preferred that conductive film 45 and the second metal film 18 are made of gold (Au). To form the alloy layer at a relatively low temperature, it is preferred that the first metal film 46 is a tin (Sn) film or a tin-containing film. When the first metal film 46 is bonded to the second metal film 18, an Au—Sn alloy layer can be formed at the interface therebetween. In this case, since an electrical conduction between the pressure holding member 4 and the semiconductor chip 2 is achieved by the conductive film 46, it is possible to reduce the occurrence of noises. The pressure holding member 4 with the conductive film 45 also works as an electromagnetic shield. In addition, a mechanical strength of the semiconductor-chip mounting substrate is improved. When the pressure holding member 4 is bonded to the substrate 1 such that an interior of the concave 17 is sealed in air-tight manner, it is possible to prevent the occurrence of condensation in the concave.

Figure 9:
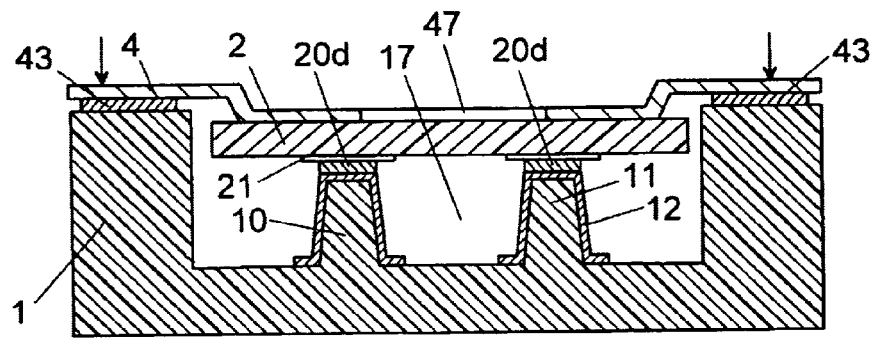
FIG. 9 is a schematic cross-sectional view illustrating a second modification of the second embodiment.

As a second modification of the second embodiment, as shown in FIG. 9, when the semiconductor chip 2 is an optical element such as LED, it is preferred that the pressure holding member 4 has an aperture 47 in the first surface 41, through which a transmission of light between the optical element 2 placed in the concave 17 and the outside becomes possible. Alternatively, the pressure holding member 4 may have a window portion (not shown) made of an optically transparent material, through which the transmission of light between the optical element 2 placed in the concave 17 and the outside becomes possible.

(Third Embodiment)

In the third embodiment, as shown in FIGS. 10A to 10C and 11, a part of a semiconductor-chip mounting substrate having substantially the same structure as that of the second embodiment is encapsulated in a second substrate 100 of a resin material. Another two semiconductor chips 2 are mounted on a top surface of the second substrate 100 by the same method as the first embodiment. Thus, the present embodiment presents a multi chip module, which is characterized by three-dimensionally mounting a plurality of semiconductor chips 2 on and in the substrate 100. With respect to the semiconductor chip 2 mounted in the second substrate 100, the contact pressure between the first bumps 10 and the second bumps 20 is further increased through the pressure holding member 4 by a shrinkage caused by curing of the resin material of the second substrate 100.

Figure 10A:
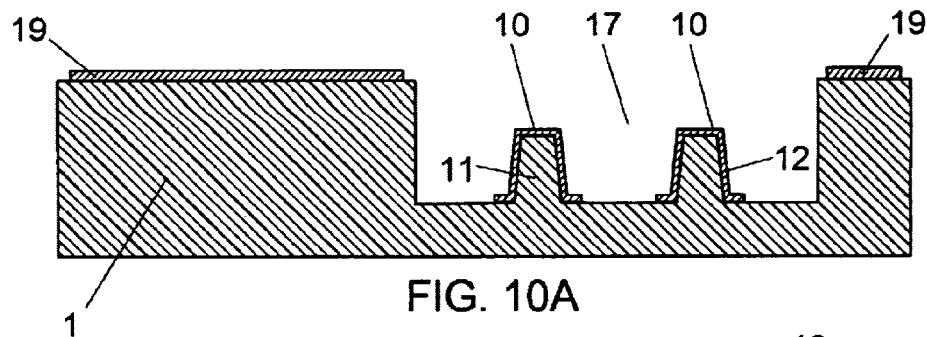
FIGS. 10A to 10C are schematic cross-sectional views illustrating a method of manufacturing a semiconductor-chip mounting substrate according to a third embodiment of the present invention.

As an example, this multi chip module can be manufactured by the following method. First, as shown in FIG. 10A, a first substrate 1 is prepared, which is substantially the same structure as the substrate 1 of the second embodiment except that a top surface of the first substrate is extended in a horizontal direction. Conductive layers 12 are formed on projections 11 integrally molded at a bottom of a concave 17 with the first substrate 1 to obtain the first bumps 10. In addition, conductive patterns 19 are formed on the top surface of the first substrate 1 around the concave 17.

Figure 10B:
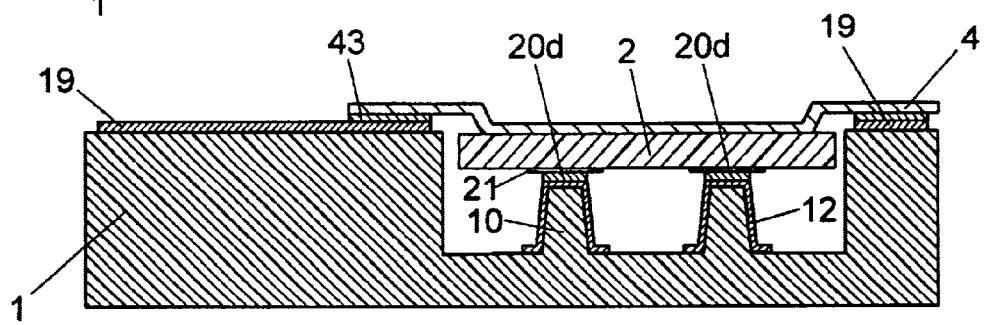

Next, as shown in FIG. 10B, the semiconductor chip 2 is placed in the concave 17 of the first substrate 1 such that the first bumps 10 contact the second bumps 20. Then, a pressure holding member 4 is bonded to the first substrate 1 by use of an adhesive 43 such that a first surface 41 of the pressure holding member 4 pushes the semiconductor chip 2 toward the first substrate 1, to thereby maintain a required contact pressure between the first bumps 10 and the second bumps 20.

Figure 10C:
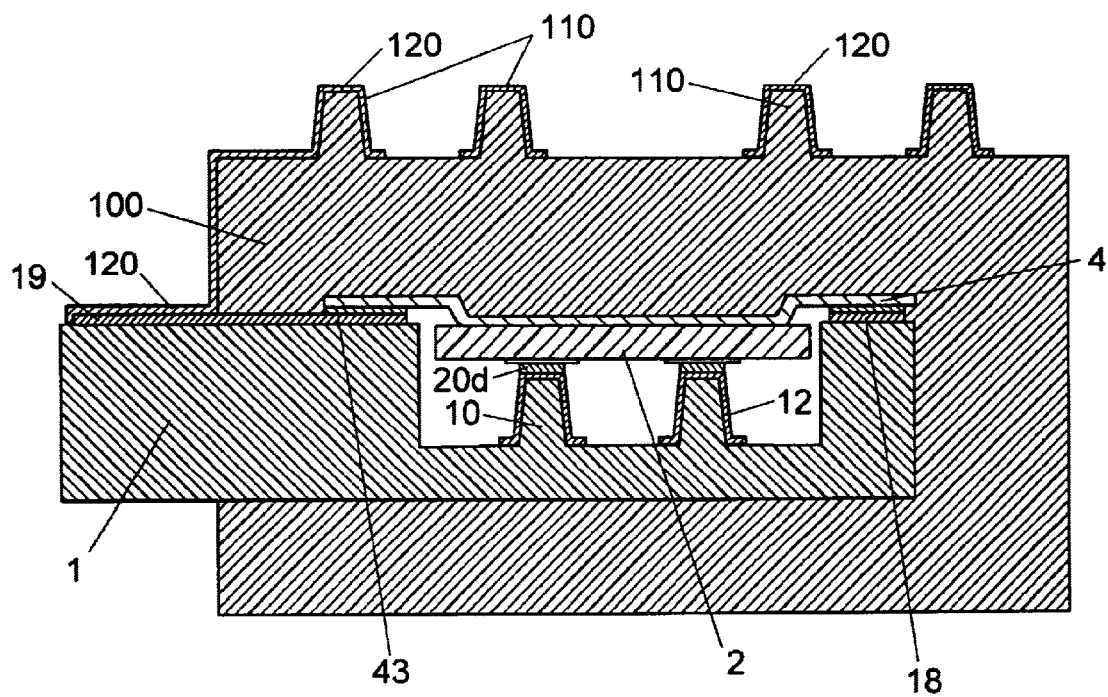

Next, as shown in FIG. 10C, the second substrate 100 is molded on the first substrate 1 by injection molding such that a part of the first substrate is encapsulated in the second substrate. In this embodiment, the second substrate 100 is molded such that a part of the conductive pattern 19 on the extended top surface of the first substrate 1 is exposed. Since the contact pressure between the first bumps 10 and the second bumps 20 is increased through the pressure holding member 4 by a shrinkage caused by curing of the resin material of the second substrate 100, it is possible to further improve the reliability of the electrical connections between those bumps. In the present embodiment, a conductive layer 120 of one of first bumps 110 of the second substrate 100 is extended along a side of the second substrate to make an electrical connection between the conductive patter 19 on the first substrate 1.

Figure 11:
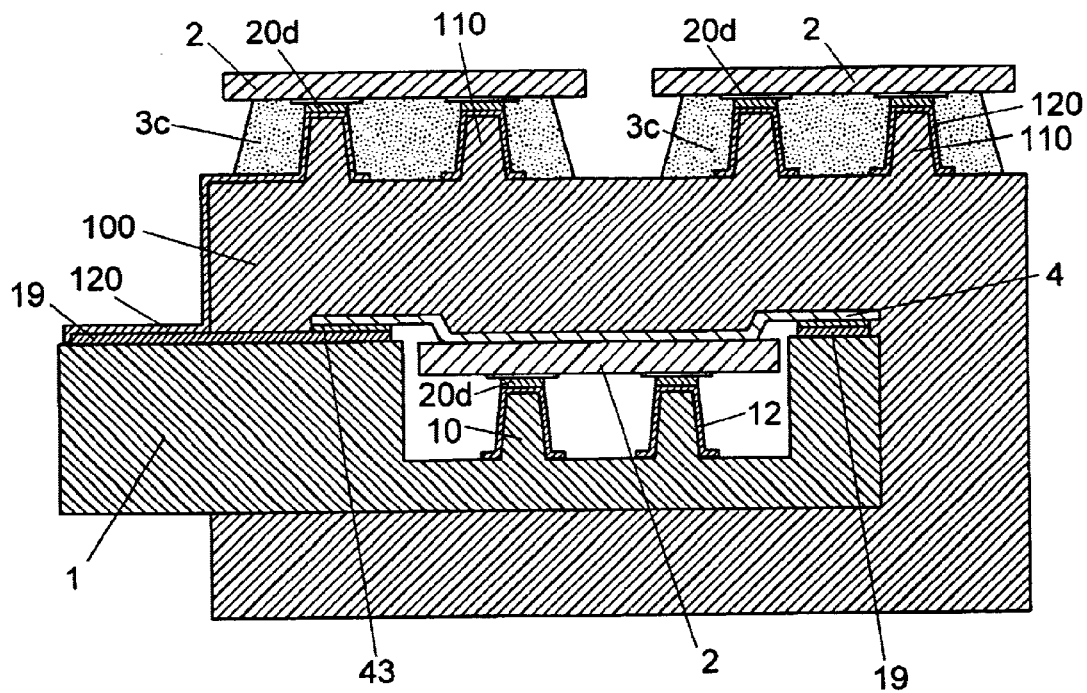
FIG. 11 is a schematic cross-sectional view illustrating the semiconductor-chip mounting substrate of the third embodiment.

By mounting another semiconductor chips 2 on the top surface of the second substrate 100 according to the same method as the first embodiment, it is possible to obtain the multi chip module composed of a plurality of semiconductor-chip mounting substrates with the pressure holding means of the present invention, as shown in FIG. 11.

Figure 12:
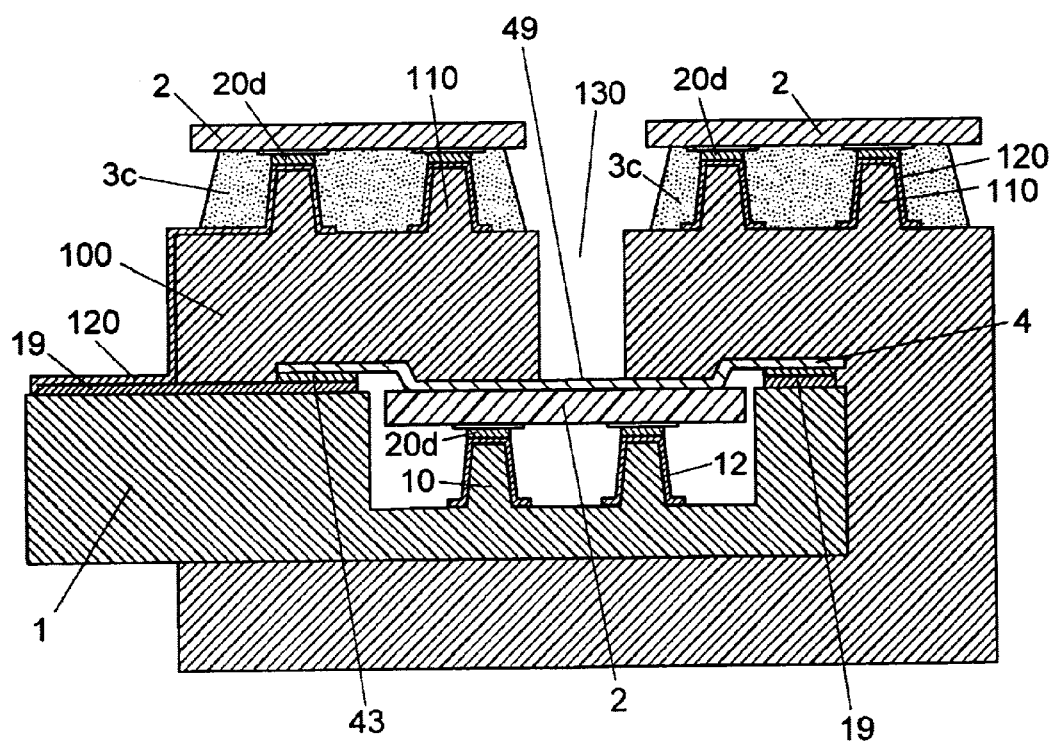
FIG. 12 is a schematic cross-sectional view illustrating a modification of the third embodiment.

As a modification of the third embodiment, when the semiconductor chip 2 is an optical element such as LED, it is preferred that the pressure holding member 4 has a window portion 49 made of an optically transparent material, and the second substrate 100 has an aperture 130, as shown in FIG. 12. In this case, the transmission of light between the optical element 2 placed in the concave 17 of the first substrate 1 and the outside becomes possible through the window portion 49 and the aperture 130.

As described above, according to the present invention, since the required contact pressure between the first bumps of the substrate and the second bumps of the semiconductor chip is stably maintained by the pressure holding means, it is possible to provide the semiconductor-chip mounting substrate having high reliability of the electrical connections therebetween.

That is, when the pressure holding means is a resin material having a greater coefficient of linear expansion than the substrate material, a shrinkage caused by curing of the resin material filled in the space between the substrate and the semiconductor chip maintains the required contact pressure between the first and second bumps to ensure the high reliability of the electrical connections therebetween over an extended time period.

On the other hand, when it is not desired that the resin material contacts the semiconductor chip, it is preferred to use a pressure holding member in place of the resin material. In this case, the second bumps of the semiconductor chip placed in the concave of the substrate are pressed against the first bumps of the substrate by the pressure holding member. In addition, a shrinkage caused by curing of an adhesive used to bond the pressure holding member to the substrate further increases the contact pressure between the first and second bumps. Thus, the high reliability of the electrical connections between the first and second bumps can be ensured by use of the pressure holding member.

In particular, when a plurality of semiconductor chips including an optical element such as LED are three-dimensionally mounted on and in the substrate, it is possible to provide a multi chip module having high reliability of the electrical connections between each of the semiconductor chips and the substrate by use of a suitable combination of the resin material and the pressure holding member.

What is claimed is:

1. A semiconductor device comprising:
a substrate having at least one integrally molded projection thereon;
a first bump obtained by forming a conductive layer on said projection; and
a semiconductor chip having a terminal projecting as a second bump on its surface;
wherein said semiconductor chip is mounted on said substrate such that said first bump contacts said second bump, and said semiconductor device comprises a pressure holding means for providing a required contact pressure between said first bump and said second bump,
wherein said contact pressure is within a range of 28 to 170 N/mm$^2$, at which said first bump is in an elastic deformation range, and said second bump is in plastic deformation range.

2. The semiconductor device as set forth in claim 1, wherein said pressure holding means is a resin material filled and cured in a space between said substrate and said semiconductor chip.

3. Then semiconductor device as set forth in claim 2, wherein said resin material has a coefficient of linear expansion greater than a material of said substrate.

4. The semiconductor device as set forth in claim 3, wherein a difference in the coefficient of linear expansion between said resin material and the material of said substrate is in a range of $5 \times 10^{-6}/°$ C. to $60 \times 10^{-6}/°$ C.

5. The semiconductor device as set forth in claim 1, wherein the surface roughness of at least a top surface of said first bump is in a range of 0.1 to 3 $\mu$m.

6. The semiconductor device as set forth in claim 1, wherein a side of said first bump is a conductive-layer free surface, at which a side of said projection is exposed.

7. The semiconductor device as set forth in claim 1, wherein said substrate comprises a second projection as a stopper, which has a height of preventing the occurrence of an excessive contact pressure between said first bump and said second bump when said semiconductor chip is mounted on said substrate.

8. The semiconductor device as set forth in claim 1, wherein said substrate has a recess for receiving said second bump of said semiconductor chip in a top surface of said first bump.

9. The semiconductor device as set forth in claim 1, wherein one of said first bump and said second bump has a surface layer of a metal material selected from tin and tin alloys, the other one has a gold layer, and wherein the semiconductor device comprises a solid state diffusion layer of tin and gold formed at an interface between said first and second bumps.

10. The semiconductor device as set forth in claim 1, wherein the material of said substrate has an elastic modulus of 5 GPa or more.

11. The semiconductor device as set forth in claim 1, wherein said conductive layer includes a nickel layer having a thickness of 5 $\mu$m or more.

12. The semiconductor device as set forth in claim 2, wherein said at least one projection is a plurality of projections, and said substrate has a concave between adjacent projections, in which said resin material is filled.

13. The semiconductor device as set forth in claim 1, wherein said first bump is pressed against said second bump through a cushion member of a metal material having a high plastic-deformation capability.

14. The semiconductor device as set forth in claim 1, wherein said first bump is of a tapered shape having a flat top end, and a value determined by dividing a height of said first bump by a diameter of a circle having substantially the same area as a base of said first bump is 0.5 or more.

15. The semiconductor device as set forth in claim 1, wherein said substrate has a concave, in which said semiconductor chip can be incorporated, said first bump is integrally molded at a bottom surface of said concave with said substrate, said pressure holding means is a pressure holding member having a first surface adapted to contact a surface opposed to said second bump of said semiconductor chip, and a second surface extending around said first surface, wherein the second surface of said pressure holding member is bonded to said substrate such that the first surface of said pressure holding member pushes said semiconductor chip placed in said concave toward said substrate, to thereby provide the required contact pressure between said first bump and said second bump.

16. A semiconductor device comprising:

a substrate having at least one projection thereon, which is integrally molded with said substrate;

a first bump obtained by forming a conductive layer on said projection; and a semiconductor chip having a terminal projecting as a second bump on its surface;

wherein said semiconductor chip is mounted on said substrate such that said first bump contacts said second bump, and said semiconductor device comprises a pressure holding means for providing a required contact pressure between said first bump and said second bump, wherein said substrate has a concave, in which said semiconductor chip can be incorporated.

said first bump is integrally molded at a bottom surface of said concave with said substrate, said pressure holding means is a pressure holding member having a first surface adapted to contact a surface opposed to said second bump of said semiconductor chip, and a second surface extending around said first surface, wherein the second surface of said pressure holding member is bonded to said substrate such that the first surface of said pressure holding member pushes said semiconductor chip placed in said concave toward said substrate, to thereby provide the required contact pressure between said first bump and said second bump, wherein said pressure holding member has a conductive film on at least said first surface, and a first metal film formed on said second surface so as to make an electrical connection with said conductive film, said substrate has a second metal film on a top surface around said concave, and wherein the said pressure holding member is bonded to said substrate through an alloy layer generated at an interface between said first metal film and said second metal film.

17. The semiconductor device as set forth in claim 15, wherein said pressure holding member is bonded to said substrate such that an interior of said concave is sealed in air-tight manner.

18. A semiconductor device comprising:

a substrate having at least one projection thereon, which is integrally molded with said substrate;

a first bump obtained by forming a conductive layer on said projection; and a semiconductor chip having a terminal projecting as a second bump on its surface;

wherein said semiconductor chip is mounted on said substrate such that said first bump contacts said second bump, and said semiconductor device comprises a pressure holding means for providing a required contact pressure between said first bump and said second bump, wherein said substrate has a concave, in which said semiconductor chip can be incorporated, said first bump is integrally molded at a bottom surface of said concave with said substrate, said pressure holding means is a pressure holding member having a first surface adapted to contact a surface opposed to said second bump of said semiconductor chip, and a second surface extending around said first surface, wherein the second surface of said pressure holding member is bonded to said substrate such that the first surface of said pressure holding member pushes said semiconductor chip placed in said concave toward said substrate, to thereby provide the required contact pressure between said first bump and said second bump, and wherein said semiconductor chip is an optical element, and said pressure holding member has an aperture in the first surface, through which a transmission of light between said optical element placed in said concave and an outside of the semiconductor device becomes possible.

19. A semiconductor device comprising:

a substrate having at least one projection thereon, which is integrally molded with said substrate;

a first bump obtained by forming a conductive layer on said projection; and a semiconductor chip having a terminal projecting as a second bump on its surface;

wherein said semiconductor chip is mounted on said substrate such that said first bump contacts said second bump, and said semiconductor device comprises a pressure holding means for providing a required contact pressure between said first bump and said second bump, wherein said substrate has a concave, in which said semiconductor chip can be incorporated, said first bump is integrally molded at a bottom surface of said concave with said substrate, said pressure holding means is a pressure holding member having a first surface adapted to contact a surface opposed to said second bump of said semiconductor chip, and a second surface extending around said first surface, wherein the second surface of said pressure holding member is bonded to said substrate such that the first surface of said pressure holding member pushes said semiconductor chip placed in said concave toward said substrate, to thereby provide the required contact pressure between said first bump and said second bump, and wherein said semiconductor chip is an optical element, and said pressure holding member has a window portion made of an optically transparent material, through which a transmission of light between said optical element placed in said concave and an outside of the semiconductor device becomes possible.

20. A semiconductor device comprising:

a substrate having at least one projection thereon, which is integrally molded with said substrate;

a first bump obtained by forming a conductive layer on said projection, and a semiconductor chip having a terminal projecting as a second bump on its surface;

wherein said semiconductor chip is mounted on said substrate such that said first bump contacts said second bump, and said semiconductor device comprises a pressure holding means for providing a required contact pressure between said first bump and said second bump, wherein said substrate has a concave, in which said semiconductor chip can be incorporated, said first bump is integrally molded at a bottom surface of said concave with said substrate, said pressure holding means is a pressure holding member having a first surface adapted to contact a surface opposed to said second bump of said semiconductor chip, and a second surface extending around said first surface, wherein the second surface of said pressure holding member is bonded to said substrate such that the first surface of said pressure holding member pushes said semiconductor chip placed in said concave toward said substrate, to thereby provide the required contact pressure between said first bump and said second bump, and wherein at least a part of said semiconductor device is encapsulated in a second substrate of a resin material, so that a shrinkage caused by curing of said resin material increases the contact pressure between said first bump and said second bump through said pressure holding member.

21. The semiconductor device as set forth in claim 20, wherein said semiconductor chip is an optical element, and said pressure holding member has a window portion made of an optically transparent material, said second substrate has a aperture, and wherein a transmission of light between said optical element placed in said concave and an outside of the semiconductor device becomes possible through said window portion and said aperture.

22. The semiconductor device as set forth in claim 1, wherein said contact pressure is within a range of 57 to 110 N/mm$^2$.

* * * * *

UNITED STATES PATENT AND TRADEMARK OFFICE
CERTIFICATE OF CORRECTION

PATENT NO. : 6,713,844 B2
DATED : March 30, 2004
INVENTOR(S) : Tatsuta et al.

It is certified that error appears in the above-identified patent and that said Letters Patent is hereby corrected as shown below:

Column 5,
Line 40, change "this sold state" to -- this solid state --.

Column 11,
Line 12, change "the conductive patter" to -- the conductive pattern --.

Signed and Sealed this

Twenty-third Day of November, 2004

JON W. DUDAS
*Director of the United States Patent and Trademark Office*